US011398372B2

(12) United States Patent
Okita et al.

(10) Patent No.: US 11,398,372 B2
(45) Date of Patent: Jul. 26, 2022

(54) PLASMA PROCESSING APPARATUS AND PLASMA PROCESSING METHOD

(71) Applicant: Panasonic Intellectual Property Management Co., Ltd., Osaka (JP)

(72) Inventors: Shogo Okita, Hyogo (JP); Hiromi Asakura, Hyogo (JP); Syouzou Watanabe, Osaka (JP); Noriyuki Matsubara, Osaka (JP); Mitsuru Hiroshima, Osaka (JP); Toshihiro Wada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 452 days.

(21) Appl. No.: 14/818,415

(22) Filed: Aug. 5, 2015

(65) Prior Publication Data

US 2016/0064188 A1    Mar. 3, 2016

(30) Foreign Application Priority Data

Aug. 27, 2014  (JP) .............................. JP2014-172787

(51) Int. Cl.
*H01J 37/32*   (2006.01)
*H01L 21/68*   (2006.01)

(52) U.S. Cl.
CPC .. *H01J 37/32715* (2013.01); *H01J 37/32366* (2013.01); *H01J 37/32733* (2013.01); *H01L 21/681* (2013.01)

(58) Field of Classification Search
CPC .......... H01J 37/32715; H01J 37/32733; H01L 21/681
See application file for complete search history.

(56) References Cited

U.S. PATENT DOCUMENTS

2009/0189054 A1*  7/2009  Campidell ........ H01L 21/67282
                                                              250/206
2010/0216313 A1*  8/2010  Iwai .................. H01J 37/32623
                                                              438/729

(Continued)

FOREIGN PATENT DOCUMENTS

JP        2006-269915 A    10/2006
JP        2009-94436 A      4/2009

(Continued)

OTHER PUBLICATIONS

Senda et al., JP 2006-269915 (machine translation) (Year: 2006).*

*Primary Examiner* — Parviz Hassanzadeh
*Assistant Examiner* — Nathan K Ford
(74) *Attorney, Agent, or Firm* — Pearne & Gordon LLP

(57) ABSTRACT

A plasma processing apparatus that performs plasma processing to a substrate held on a transport carrier including a frame and a holding sheet that covers an opening of the frame includes: a transport mechanism that transports the transport carrier; a position measuring section that measures a position of the substrate to the frame; a plasma processing section that includes a plasma processing stage on which the transport carrier is loaded and a cover that covers the frame and a part of the holding sheet loaded on the plasma processing stage, and has a window section for exposing a part of the substrate; and a control section that controls the transport mechanism such that the transport carrier is loaded on the plasma processing stage to satisfy a positional relationship between the window section and the substrate based on the position information of the substrate to the frame.

12 Claims, 11 Drawing Sheets

(56) References Cited

U.S. PATENT DOCUMENTS

2012/0238073 A1    9/2012  Johnson et al.
2014/0352889 A1*  12/2014  Ansell .............. H01J 37/32357
                                                   156/345.35

FOREIGN PATENT DOCUMENTS

JP         2009-255214 A      11/2009
JP         2014-513868 A       6/2014

* cited by examiner

PLASMA PROCESSING APPARATUS AND PLASMA PROCESSING METHOD

CROSS-REFERENCES TO RELATED APPLICATION(S)

This application is based on and claims priority from Japanese Patent Application No. 2014-172787 filed on Aug. 27, 2014, the entire contents of which are incorporated herein by reference.

BACKGROUND

1. Field of the Invention

One or more embodiments of the present invention relate to a plasma processing apparatus and a plasma processing method, and more specifically, to a plasma processing apparatus and a plasma processing method for processing a substrate held on a transport carrier.

2. Description of Related Art

As a method of dicing a substrate, plasma dicing has been known in which plasma etching is performed on the substrate on which a resist mask is formed and the substrate is divided into chips. Patent Document 1 discloses a technique in which a substrate is provided to a plasma processing apparatus in a state where the substrate is pasted on a transport carrier including a frame and a holding sheet that covers an opening section of the frame to improve handleability of the substrate in the transport and the like. Patent Document 2 teaches a method of matching the center of a substrate and the center of a frame when the substrate is held to a holding sheet.

Patent Document 1 is JP-A-2009-94436, and Patent Document 2 is JP-A-2006-269915.

SUMMARY

When performing plasma processing in a state where the substrate is pasted to the transport carrier, if the transport carrier is directly exposed to plasma, the holding sheet made of a resin material and adhesive for fixing the holding sheet to the frame are heated. Elongation (deformation) of the holding sheet and/or deterioration of adhesiveness of an adhesive may occur due to the heat, the holding sheet may be peeled from the frame, and thereby there is a concern that the transport carrier is damaged.

Thus, a cover made of a dielectric body having a window section is provided above a plasma processing stage within such a plasma processing apparatus. The window section is formed to have a size and a shape such that the frame is not exposed and at least a part of the substrate is exposed when viewed from above the window section. When performing plasma processing, the cover covers the frame and the holding sheet, the frame and the holding sheet are prevented from being exposed to plasma, and the substrate is exposed from the window section. A portion of the exposed substrate, where a resist mask is not formed, is etched by plasma.

In this case, the transport carrier and the substrate held on the transport carrier (hereinafter, collectively, referred to as the transport carrier holding the substrate or simply the transport carrier) are loaded on the plasma processing stage such that the center of an opening of the frame and the center of the window section of the cover match each other. Subsequently, plasma irradiation is performed and the substrate is diced into individual pieces.

However, when dicing is performed by plasma processing while protecting the transport carrier with the cover, the yield is likely to be low in the dicing process. Particularly, variation is more likely to occur in the etching shape of an edge portion of the substrate and it is more likely that an unprocessed portion is occurred in the edge portion of the substrate.

An aspect of the embodiments of the invention is a plasma processing apparatus that performs plasma processing to a substrate held on a transport carrier, the transport carrier including a frame and a holding sheet that covers an opening of the frame, the substrate being held on the holding sheet, the plasma processing apparatus including; a transport mechanism that transports the transport carrier holding the substrate; a position measuring section that measures a position of the substrate with respect to the frame; a plasma processing section that includes a plasma processing stage on which the transport carrier holding the substrate is loaded and a cover that covers the frame and at least a part of the holding sheet loaded on the plasma processing stage, and has a window section for exposing at least a part of the substrate; and a control section that controls the transport mechanism such that the transport carrier holding the substrate is loaded on the plasma processing stage to satisfy a predetermined positional relationship between the window section and the substrate based on information of the position of the substrate with respect to the frame measured by the position measuring section.

Another aspect of the invention is a plasma processing method for performing plasma processing to a substrate held on a transport carrier, the transport carrier including a frame and a holding sheet that covers an opening of the frame, the substrate being held on the holding sheet, the plasma processing method including: measuring a position of the substrate with respect to the frame by a position measuring section; and performing plasma processing by loading the transport carrier holding the substrate on a plasma processing stage included in a plasma processing section, covering the frame and at least a part of the holding sheet by a cover, and exposing at least a part of the substrate from a window section provided in the cover, wherein the transport carrier holding the substrate is loaded on the plasma processing stage to satisfy a predetermined positional relationship between the window section and the substrate based on information of the position of the substrate with respect to the frame which is measured by the position measuring section.

According to the embodiments of the invention, the yield of a product is improved when the substrate held on the transport carrier is plasma-processed.

BRIEF DESCRIPTION OF THE DRAWINGS

FIG. 1A is a top view, and FIG. 1B is a sectional view that is taken along line B-B.

DETAILED DESCRIPTION

Figure 8:
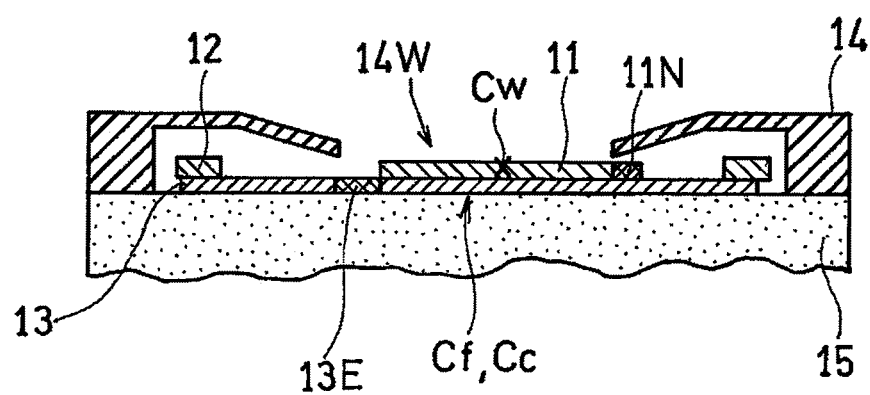
FIG. 8 is a top view illustrating a positional relationship between a cover and a transport carrier according to a method in the related art.

Reduction of the related-art yield is believed to be due to the fact that the center of a substrate and the center of a window section may be shifted (not matched). FIG. 8 is a sectional view illustrating a case where the center of the substrate and the center of the window section are not matched. For clarity, only cut surfaces are illustrated in the sectional view and an appearance behind the cut surfaces is omitted. The same applies to the following sectional views. In FIG. 8, in a plasma processing stage 15, the center (hereinafter, referred to as a frame center Cf) of an opening of a frame and the center (hereinafter, referred to as a window section center Cc) of the window section are matched, however, the center (hereinafter, referred to as a substrate center Cw) of the substrate does not match the frame center Cf and the window section center Cc. In this case, all portions (in this case, an entire surface of a substrate 11) of the substrate 11 that are to be subjected to plasma processing are not exposed from a window section 14W and a part of the substrate 11 is covered by a cover 14. As a result, an unprocessed portion 11N in which plasma etching is not performed occurs. On the other hand, an exposed portion 13E that is exposed from the window section occurs in a holding sheet 13. The holding sheet 13 having the exposed portion 13E deteriorates by being exposed to the plasma. Thus, there is a possibility to lead to a situation that the substrate 11 falls off from a frame 12 together with the holding sheet 13.

If the plasma resistance of the holding sheet 13 is high, or if deterioration of the holding sheet 13 due to exposure to the plasma may be allowable to some extent, the size of the window section 14W may be greater than that of the substrate 11. In this case, even if the substrate center Cw and the window section center Cc are not matched, all portions of the substrate 11 that are to be subjected to plasma processing can be exposed from the cover 14. However, since a distance between an end portion of an inside of the cover 14 and an edge of the substrate 11 is not constant, plasma processing is not uniformly performed in the edge portion of the substrate 11 and variation in an etching shape occurs in the edge portion of the substrate 11.

In a dicing apparatus using a related-art dicing blade or laser, on the principle, a portion corresponding to the cover 14 is not provided and the unprocessed portion due to the cover is unlikely to occur. Furthermore, the cutting position of the dicing blade or an irradiation position of the laser may be appropriately adjusted on a stage on which the dicing is performed. Thus, even if the substrate is loaded on the stage deviated from a predetermined position, an appropriate adjustment is performed and the substrate can be diced in a desired position. That is, if the dicing is performed using the dicing blade or the laser, deviation of the center of the substrate does not significantly affect the yield.

In plasma processing, in the related art, in a process before the transport carrier is loaded on the plasma processing stage, the transport carrier is aligned such that the frame center Cf and the window section center Cc of the cover match. For example, before plasma processing, the transport carrier is loaded on an alignment stage disposed in an alignment section and a center of the alignment stage and the frame center Cf are matched (hereinafter, referred to as centering). As a method of centering, for example, there is a method of correcting a position of the transport carrier by sandwiching the transport carrier from four directions by abutting members disposed around the alignment stage, and the like. Subsequently, a transport arm in which a transport track is adjusted in advance so as to match the center (that is, the frame center Cf) of the alignment stage and the window section center Cc, loads the transport carrier that is centered on the plasma processing stage. Thus, the frame center Cf and the window section center Cc match. As described above, the window section center Cc and the frame center Cf can relatively easily match.

That is, because the substrate center Cw and the frame center Cf do not match with high precision, the substrate center Cw and the window section center Cc do not match.

According to the embodiments of the invention, when the substrate is held on the transport carrier, it is possible to improve yield of a plasma etching process without requiring the substrate center Cw and the frame center Cf to be precisely matched.

An embodiment of the invention will be described in detail with reference to the drawings.

Figure 1A:
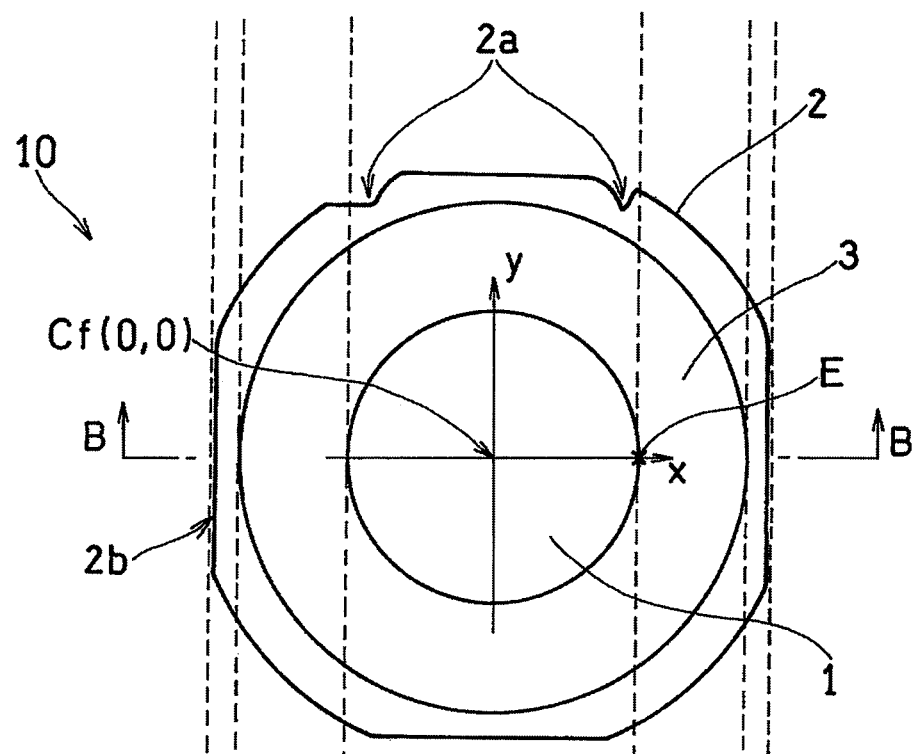
FIG. 1A and 1B are views schematically illustrating a transport carrier holding a substrate according to an embodiment of the invention.
Figure 1B:
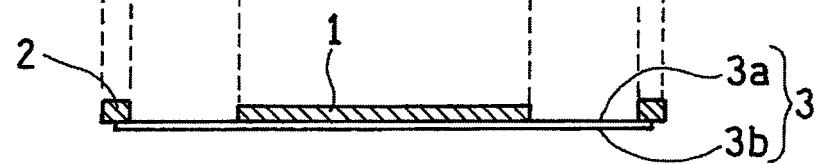

FIG. 1A is a top view schematically illustrating a transport carrier 10 according to an embodiment of the invention and FIG. 1B is a sectional view that is taken along line B-B in FIG. 1A. The transport carrier 10 includes a frame 2 and a holding sheet 3. The holding sheet 3 has adhesive on one surface 39, is fixed to the frame 2 by adhesive, and covers an opening of the frame 2. A substrate 1 is pasted to the holding sheet 3 and is held on the transport carrier 10. In the embodiment, a case where the opening of the frame 2 and the substrate 1 are a circular shape together is described, but this is not limited.

(Frame)

The frame 2 is a frame body having an opening having an area equal to or greater than the entirety of the substrate 1 and has a predetermined width and a substantially constant thin thickness. Furthermore, the frame 2 has an inner diameter greater than an inner diameter of a cover 424 described later and has a maximum outer diameter which is less than an outer diameter of the cover 424. The frame 2 has enough rigidity to hold and transport the holding sheet 3 and the substrate 1.

The shape of the opening of the frame 2 is not specifically limited, but, for example, may be circular or polygon such as rectangular and hexagon. The frame 2 may be provided with notches 2a for positioning, corner cuts 2b, and the like. As a material of the frame 2, for example, metal such as aluminum or stainless steel, resin, and the like are included. The vicinity of an outer peripheral edge of one surface of the holding sheet 3 is pasted to one surface of the frame 2.

(Holding Sheet)

For example, the holding sheet 3 includes a surface (adhesive surface 3a) having adhesive and a surface (non-adhesive surface 3b) having no adhesive. The outer peripheral edge of the adhesive surface 3a is pasted to one surface of the frame 2 and covers the opening of the frame 2. Furthermore, the substrate 1 is pasted to the adhesive surface 3a exposed from the opening of the frame 2. It is preferable that the adhesive surface 3a is made of an adhesive component having an adhesive force that is decreased by the irradiation of ultraviolet light. The substrate (chip) that is diced by performing irradiation of the ultraviolet light after dicing is easily peeled from the adhesive surface 3a and is easily picked up. For example, the holding sheet 3 may be formed of UV-curable acrylic adhesive (adhesive surface 3a) and a polyolefin-made base material (non-adhesive surface 3b).

(Substrate)

The substrate 1 is an object of a plasma processing and is not specifically limited. A material of the substrate 1 is not specifically limited. For example, the material may be a semiconductor, may be dielectric body, may be metal, or may be a laminated body thereof. As the semiconductor, Si, GaAs, GaN, SiC, and the like may be exemplified. In addition, as the dielectric body, $SiO_2$, $LiTaO_3$, $LiNbO_3$, and the like may be exemplified. A size of the substrate 1 is not specifically limited and, for example, is approximately 50 mm to 300 mm. Furthermore, a shape of the substrate 1 is not specifically limited and, for example, is circular or polygon. The substrate 1 may be provided with orientation flat and a cutout such as a notch.

A resist mask (not illustrated) having a desired shape is formed on a surface of the substrate 1 which is not pasted to the holding sheet 3. A portion where the resist mask is formed is protected from etching by the plasma. A portion where the resist mask is not formed may be etched by the plasma from a surface to a back surface.

Hereinafter, in order to define the position of the substrate 1 with respect to the transport carrier 10 and the like, description may be given by introducing a coordinate system on the transport carrier 10. In FIG. 1A, the frame center Cf is an original point (0, 0), a side of a pair of notches 2a provided in the frame 2 is a positive direction of a Y axis, and a direction orthogonal to the Y axis is an X axis.

(Plasma Processing Apparatus)

Figure 2:
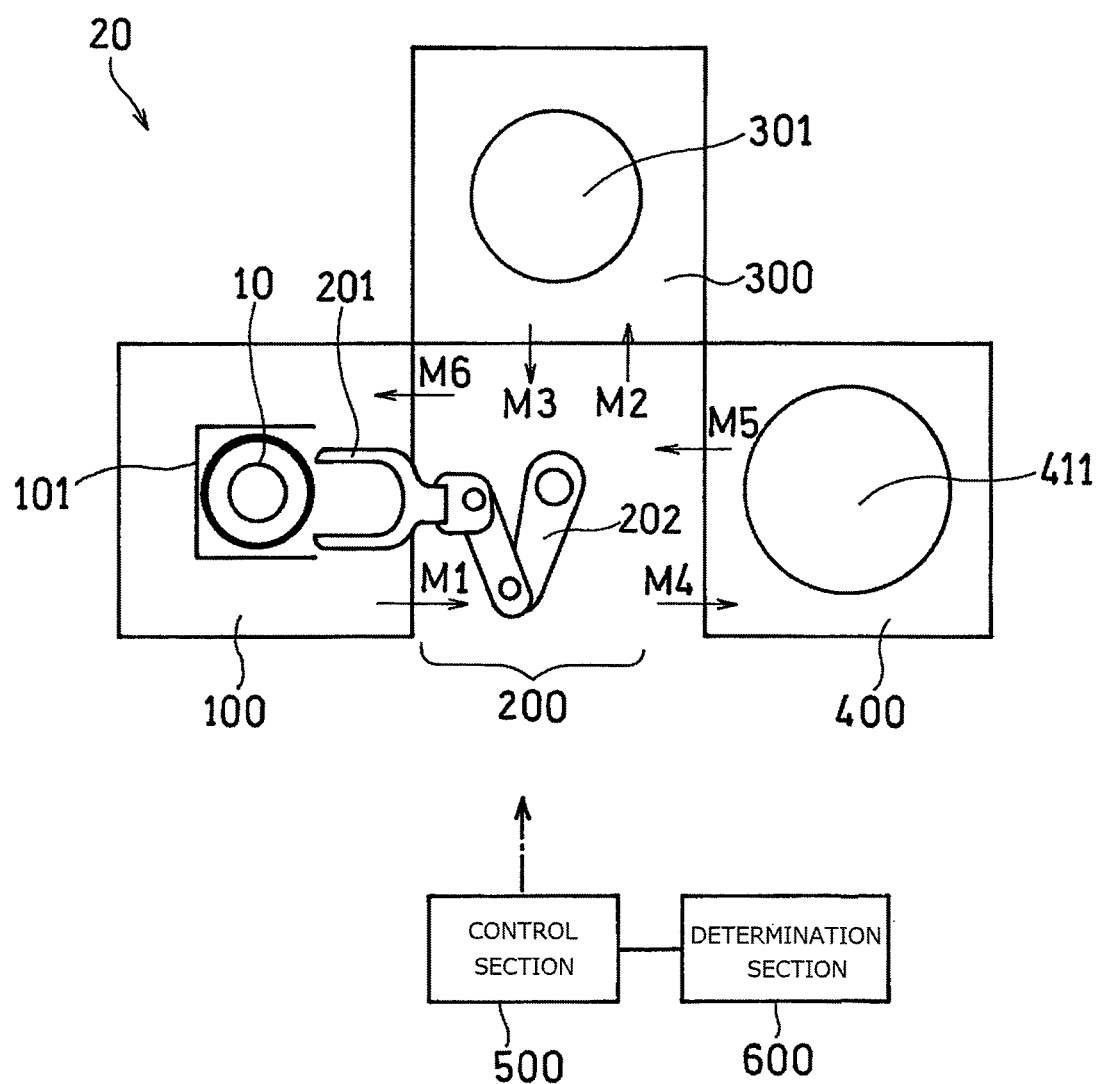
FIG. 2 is a conceptual view of a plasma processing apparatus according to the embodiment of the invention.

FIG. 2 is a conceptual view illustrating a plasma processing apparatus according to the embodiment of the invention.

For example, a plasma processing apparatus 20 includes a cassette section 100 accommodating the transport carrier 10, a transport mechanism 200 for transporting the transport carrier 10, a control section 500 that controls the transport mechanism 200, a position measuring section 300, and a plasma processing section 400. For example, the cassette section 100 includes a cassette 101 having a support member for accommodating a plurality of transport carriers 10. For example, the transport mechanism 200 includes a transport fork 201 and a transport arm 202 that supports the transport fork 201. The position measuring section 300 may include a measuring stage 301 on which the transport carrier 10 is loaded. The plasma processing section 400 includes a plasma processing stage 411 on which the transport carrier 10 is loaded. Furthermore, the plasma processing apparatus 20 may include a determination section 600. The determination section 600 is described later.

The transport fork 201 holds the transport carrier 10 always in the same direction with respect to the transport carrier 10. For example, the transport fork 201 holds the transport carrier 10 from the side of the pair of positioning notches 2a (see FIG. 1A) provided in the frame of the transport carrier 10. Furthermore, the transport fork 201 is controlled to enter and exit from all of the cassette section 100, the position measuring section 300, and the plasma processing section 400 in the same direction, respectively. Symbols M1 to M6 indicate movements (entrance and exit) of the transport mechanism 200.

(Plasma Processing Section)

Figure 3:
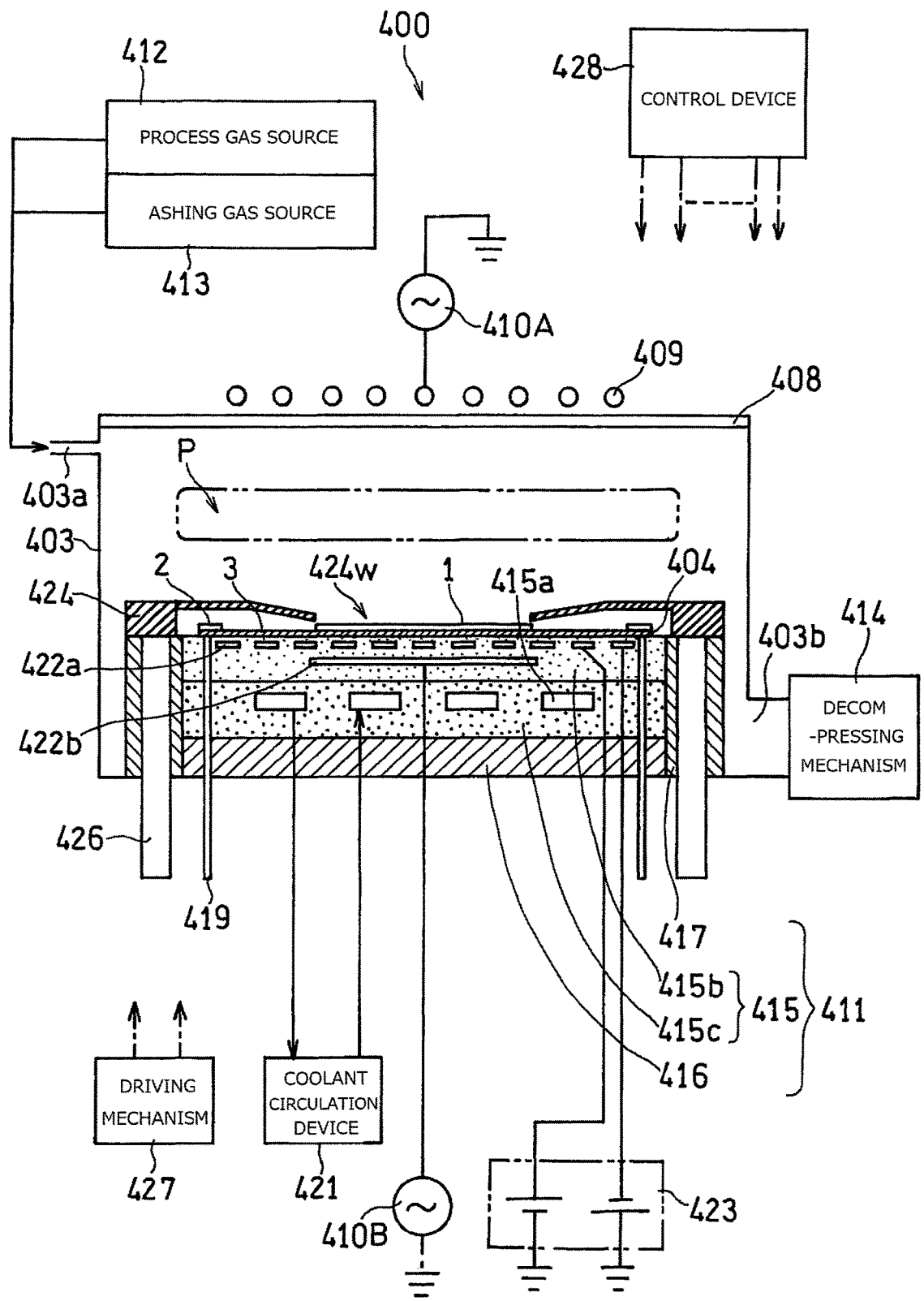
FIG. 3 is a sectional view schematically illustrating a plasma processing section according to the embodiment of the invention.

FIG. 3 schematically illustrates a cross section of the plasma processing section 400 according to the embodiment of the invention. The plasma processing section 400 includes the plasma processing stage 411 and the cover 424 including a window section 424W that covers the frame 2 and at least a part of the holding sheet 3 and exposes at least a part of the substrate 1 above the plasma processing stage 411.

The plasma processing stage 411 and the cover 424 are disposed within a vacuum chamber 403. In the embodiment, a top portion of the vacuum chamber 403 is closed by a dielectric wall 408 and an antenna (plasma source) 409 as an upper electrode is disposed above the dielectric wall 408. The antenna 409 is electrically connected to a first high-frequency power supply 410A. The plasma processing stage 411 is disposed on a bottom section side within the vacuum chamber 403.

The transport carrier 10 is loaded on the plasma processing stage 411 such that the surface (adhesive surface 3a) of the holding sheet 3 holding the substrate 1 faces upward. In this case, the transport carrier 10 is loaded on the plasma processing stage 411 by a transport mechanism (not illustrated) to satisfy a predetermined positional relationship between the window section 424W and the substrate 1 based on position information of the substrate 1 with respect to the frame 2 that is measured by the position measuring section 300. A method of loading the transport carrier 10 on the plasma processing stage 411 by the transport mechanism will be described later.

The vacuum chamber 403 is connected to a gas introduction port 403a. The gas introduction port 403a is connected to a process gas source (gas supply unit) 412 that is a supply source of gas for generating the plasma and an ashing gas source 413 that is another supply source of gas for generating the plasma by a pipe. Furthermore, the vacuum chamber 403 is provided with an exhaust port 403b and the exhaust port 403b is connected to a decompressing mechanism 414 including a vacuum pump for exhausting and decompressing gas within the vacuum chamber 403.

The plasma processing stage 411 includes an electrode section 415 that is electrically connected to a second high-frequency power supply 410B, a base section 416 that holds the electrode section 415, and an exterior section 417 that surrounds an outer periphery of the electrode section 415 and the base section 416. The electrode section 415 includes an electrostatic chuck 415b made of the dielectric body in which electrostatic chucking electrodes 422a are built and a metal electrode section body 415c. The electrostatic chucking electrodes 422a are electrically connected to a DC power supply 423. The electrostatic chucking electrodes 422a may be bipolar type or may be single-pole type.

A coolant passage 415a is formed within the electrode section 415. The coolant passage 415a performs cooling of the frame 2 and the substrate 1 loaded on the plasma processing stage 411 by cooling the plasma processing stage 411 and cooling of the plasma processing stage 411 and the cover 424 with which a part of the plasma processing stage 411 comes into contact. A coolant circulation device 421 circulates coolant within the coolant passage 415a.

A plurality of lifting pins 419 passing through the plasma processing stage 411 are disposed in the plasma processing stage 411. The lifting pins 419 are driven by a driving mechanism 427 to be elevated and lowered. When the lifting pins 419 are elevated, the frame 2 of the transport carrier 10 transported by the transport mechanism 200 is held on upper end surfaces of the lifting pins 419. Next, the transport mechanism 200 is exited from the plasma processing section 400, the lifting pins 419 are lowered to the same level as the plasma processing stage 411, and then the transport carrier 10 is loaded on the plasma processing stage 411.

A plurality of lifting rods 426 are connected to one end portion of the cover 424 and allow the cover 424 to be capable of elevating and lowering. Furthermore, the lifting rods 426 are also driven by the driving mechanism 427 to be elevated and lowered, but the elevating and lowering operations of the lifting rods 426 can be performed independently from the lifting pins 419.

A control device 428 controls operations of elements configuring the plasma processing section 400 including the first and second high-frequency power supplies 410A and 410B, the process gas source 412, the aching gas source 413, the decompressing mechanism 414, the coolant circulation device 421, the DC power supply 423, the driving mechanism 427, and the like.

In the embodiment, the cover 424 has a donut shape having a generally circular outer couture and includes a constant width, and a thin thickness. As described above, the inner diameter (diameter of the window section 424W) of the cover 424 is less than the inner diameter of the frame 2 and the outer diameter of the cover 424 is greater than the outer diameter of the frame 2. Thus, if the transport carrier 10 is loaded on a predetermined position of the plasma processing stage and the cover 424 is lowered, the cover 424 can cover the frame 2 and at least a part of the holding sheet 3. At least a part of the substrate 1 is exposed from the window section 424W. In this case, the cover 424 comes into contact with one of the frame 2, the holding sheet 3 and the substrate 1.

A sectional shape of the cover 424 may be gently inclined or may be curved from the outer periphery portion covering the upper portion of the frame 2 to the window section 424W. For example, the cover 424 is configured of the dielectric body such as ceramic or metal such as aluminum or aluminum of which a surface is alumite-processed. In the embodiment, an entirety of the cover 424 is configured of a single material, however, for example, may be configured of a complex body in which a material having excellent heat resistance and a material having excellent heat conduction are combined.

Figure 4A:
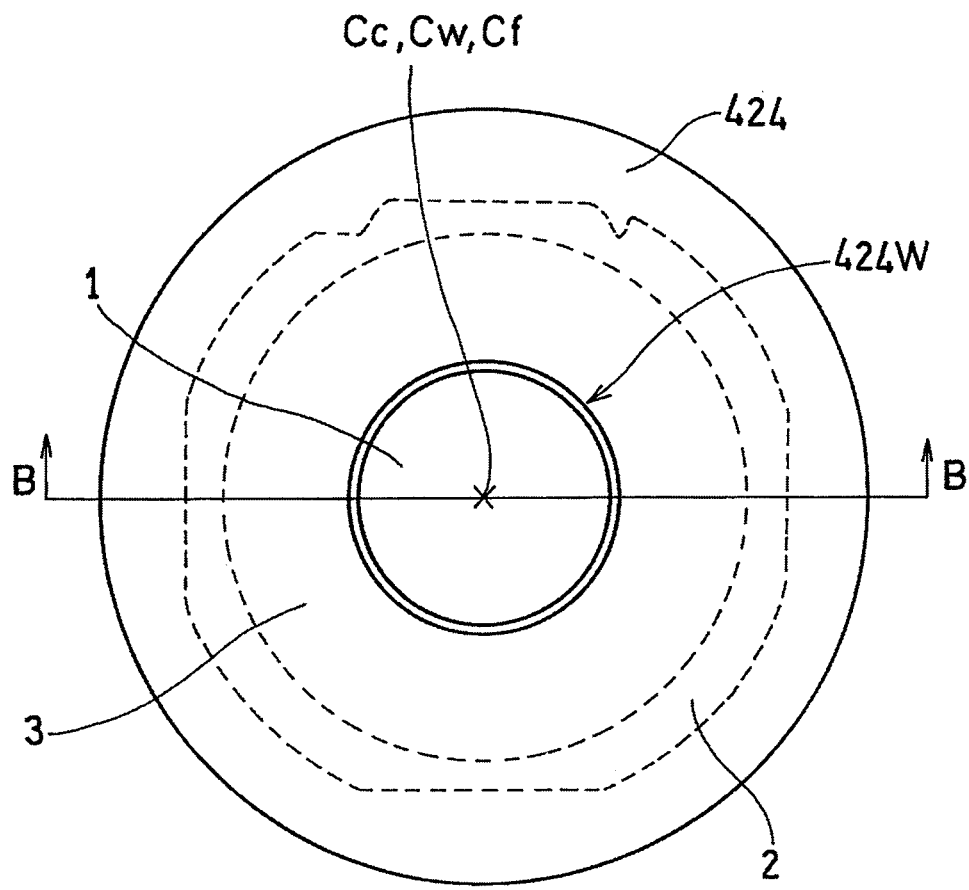
FIG. 4A is a top view illustrating a positional relationship between a cover and the transport carrier according to the embodiment of the invention.
Figure 4B:
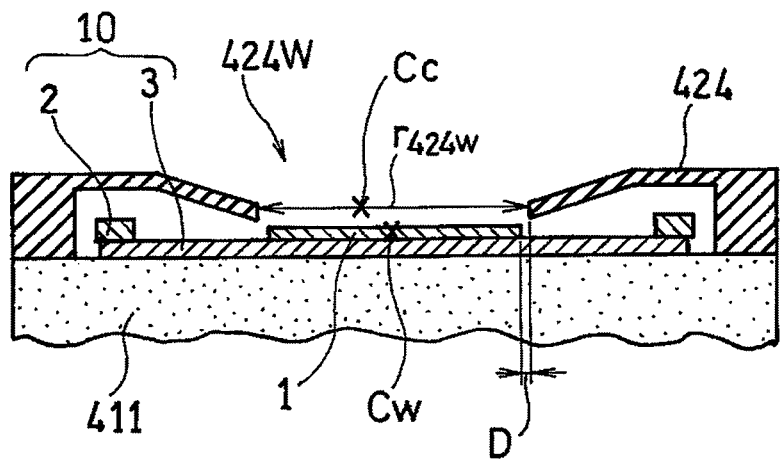
FIG. 4B is a sectional view that is taken along line B-B in FIG. 4A.

FIGS. 4A and 4B are a top view and a sectional view illustrating a positional relationship between the cover 424 and the transport carrier 10 loaded on the plasma processing stage 411. In FIGS. 4A and 4B, all the window section 424W, the substrate 1, and the opening of the frame 2 are circular, and the centers Cc, Cw, and Cf are matched with each other. The cover 424 is gently inclined toward the substrate 1. A diameter $r_{424W}$ of the window section 424W and the diameter of the substrate 1 may not necessarily be the same. If the diameter $r_{424W}$ of the window section 424W and the diameter of the substrate 1 are the same, since the holding sheet 3 is not exposed from the window section 424W, degradation of the holding sheet 3 due to the plasma is suppressed. Furthermore, since etching is uniformly performed also in an edge periphery of the substrate 1, the yield is improved. If the diameter $r_{424W}$ of the window section 424W and the diameter of the substrate 1 are not the same, in any way, since an end portion on the inside of the cover 424 and the edge of the substrate 1 keep a constant distance D, also in the edge periphery of the substrate 1, etching is uniformly performed and the yield is improved. That is, in order to improve the yield, it is required that the window section center Cc and the substrate center Cw match.

(Cassette Section)

The cassette section 100 (see FIG. 2) includes the cassette 101 having a bottom plate, a top plate, a rear plate, two side plates facing each other, and support member (neither of which is not illustrated) for accommodating the plurality of transport carriers 10 between the bottom plate and the top plate. The support members come into contact with only the frame 2 of the transport carrier 10 and may be any shape that can support the entirety of the transport carrier 10. For example, the support member may be a rod shape and may be disposed so as to protrude from the side plate. Specifically, two support members may be disposed in each side plate such that all support members are provided on the same horizontal plane. In this case, the transport carrier 10 is horizontally supported by four support members (a set of support members) described above. In order to accommodate the plurality of transport carriers 10 in the cassette 101 horizontally and with gaps, a plurality of the set of support members described above may be disposed between the bottom plate and the top plate with predetermined gaps.

The transport carrier 10 before the plasma processing is accommodated in the cassette 101 in a state in which the orientation is aligned in a predetermined direction. For example, the transport carrier 10 is accommodated so as to be taken out by the transport mechanism 200 from the side of the pair of notches 2a for positioning provided in the frame 2. The transport carrier 10 is taken out from the cassette 101 by the transport mechanism 200 and is transported to the plasma processing section 400 via the position measuring section 300. The transport carrier 10 where the plasma processing is performed returns to the cassette section 100 again and is accommodated in the cassette 101. The transport carrier 10 accommodated in the cassette 101 may be before the plasma processing, may be after the plasma processing, or may be both.

(Position Measuring Section)

The position measuring section 300 measures the position of the substrate 1 with respect to the frame 2. For example, a deviation amount AR between the frame center Cf and the substrate center Cw, and a deviation direction R are measured from image data. Thus, the position of the substrate 1 with respect to the frame 2 is digitized.

Figure 5A:
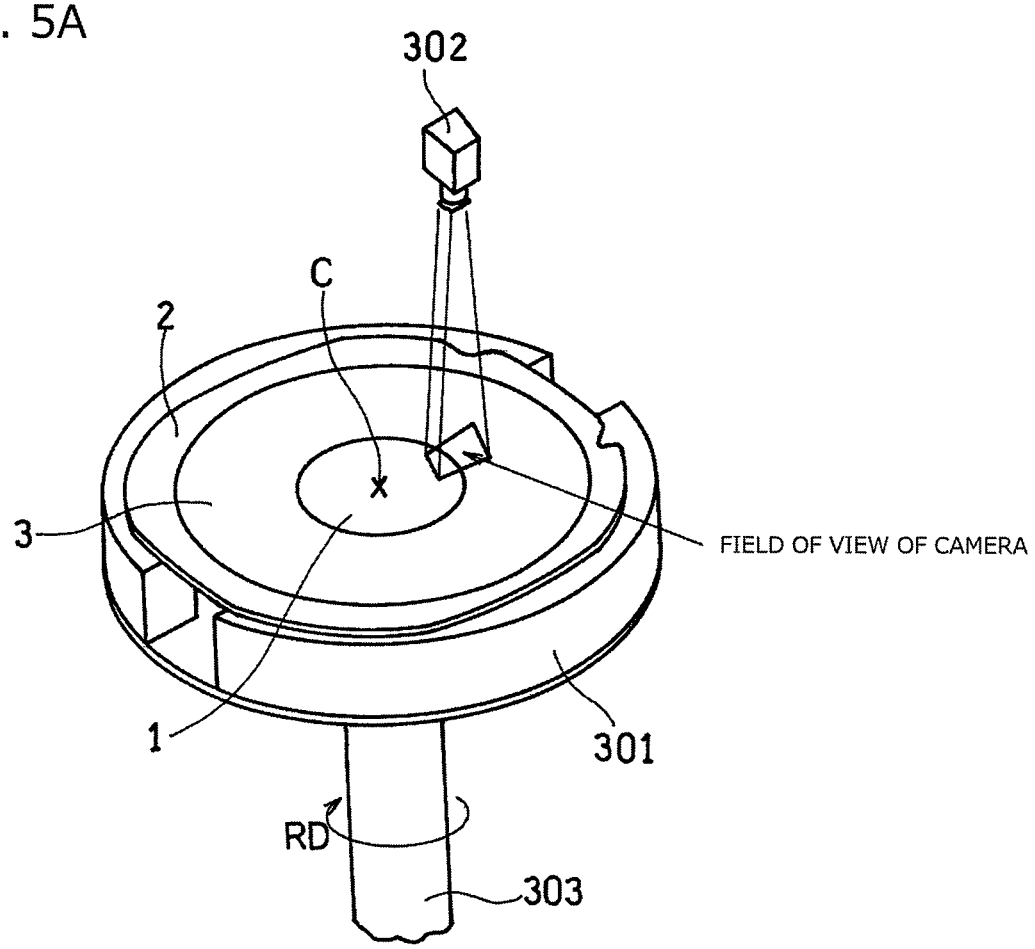
FIG. 5A is a perspective view conceptually illustrating a position measuring section according to the embodiment of the invention.

For example, as illustrated in FIG. 5A, a measuring stage 301 is disposed within the position measuring section 300 and a camera 302 is disposed above the measuring stage 301 and in a position where the edge of the substrate 1 loaded on the measuring stage 301 is imaged. A field of view of the camera 302 is illustrated in FIGS. 5A and 5C. A rotary shaft 303 is joined to or passes through a center of the measuring stage 301. The position of the edge of the substrate 1 within the field of view of the camera is imaged for one lap while rotating the transport carrier 10 together with the measuring stage 301 in a direction RD around the rotary shaft 303 as a center. An image imaged by the camera 302 is analyzed and the position (hereinafter, simply referred to as edge position) of the edge of the substrate 1 for one lap in the field of view of the camera is digitized. In this case, the transport carrier 10 is loaded on the measuring stage 301 such that the frame center Cf and a center C (hereinafter, a rotation center C) of the rotation match and, for example, the side of the notch 2a of the transport carrier 10 is always toward a predetermined direction. The method thereof will be described later. In the embodiment, imaging of the edge position is performed based on an edge E as a starting point on the X axis of the positive direction defined in FIG. 1A.

If the frame center Cf and the substrate center Cw match, the edge position of the substrate 1 in the field of view of the camera is constant regardless of a rotation angle of the rotary shaft 303. This constant edge position is set as a reference position. The reference position can be grasped in advance if a size of the substrate 1 is known. The deviation amount ΔR and the deviation direction R of the substrate center Cw and the frame center Cf can be grasped by comparing the reference position and the edge position. If the substrate center Cw and the frame center Cf do not match, the edge position is changed together with a rotation angle θ of the rotary shaft 303.

Figure 5B:
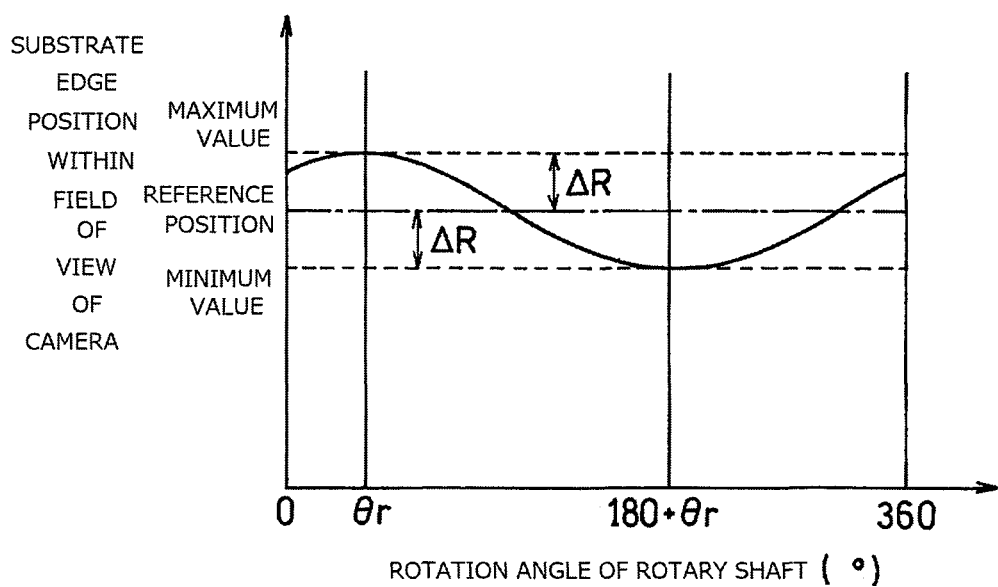
FIG. 5B is a graph illustrating data obtained by the position measuring section of FIG. 5A.
Figure 5C:
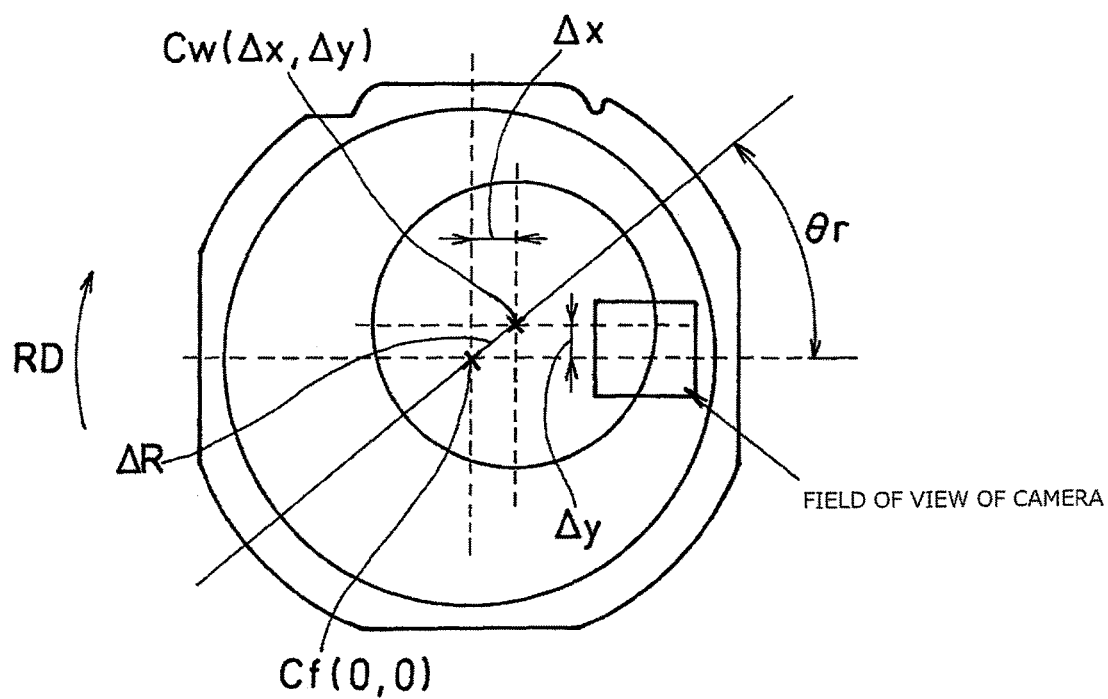
FIG. 5C is an explanatory view describing a position (Δx, Δy) of a substrate center Cw if a frame center Cf calculated based on data obtained by the position measuring section of FIG. 5A is taken as a reference (0, 0).

For example, a change in the edge position is indicated by a graph illustrated in FIG. 5B. A horizontal axis of FIG. 5B is the rotation angle of the rotary shaft 303. A vertical axis of FIG. 5B is the edge position of the substrate 1 within the field of view of the camera and indicates a distance between the edge of the substrate 1 and the frame center Cf. As described above, imaging of the edge position is performed based on the edge E as the starting point on the X axis of the positive direction in the coordinate system defined in FIG. 1A. Thus, the edge position in a rotation angle 0° in the graph of FIG. 5B indicates a distance between the edge E on the X axis of the positive direction in the coordinate system in FIG. 1A and the frame center Cf.

It is possible to derive the deviation amount ΔR and the deviation direction R between the substrate center Cw and the frame center Cf from the graph. The deviation amount ΔR is calculated as a difference between the maximum value or the minimum value of the edge position and the reference position. The deviation direction R is a direction of the rotation angle (hereinafter, referred to as a rotation angle θr) of the rotary shaft when the edge position indicates the maximum value. In the coordinate system on the transport carrier 10 defined in FIG. 1A, a coordinate (Δx, Δy) of the substrate center Cw is obtained as $\Delta x = \Delta R \times \cos(\theta r)$, $\Delta y = \Delta R \times \sin(\theta r)$ (see FIG. 5C). Thus, in the embodiment, the deviation amount ΔR and the rotation angle θr are measured and Δx and Δy are derived from the deviation amount ΔR and the deviation direction R are obtained as parameters indicating position information of the substrate 1 with respect to the frame 2.

Prior to the measurement of the deviation amount ΔR and the rotation angle θr, centering is performed to match the rotation center C and the frame center Cf. A method of centering is not specifically limited and it is possible to use a method of the related art. For example, an alignment unit (for example, drop-in and the like) corresponding to the notch 2a and the cutout formed in the frame 2 may be provided in the cassette 101, the transport fork 201 described later, or the measuring stage 301. Furthermore, abutting members (not illustrated) that can sandwich the transport carrier 10 from four directions are disposed around the measuring stage 301 within the position measuring section 300 and thereby centering may be performed within the position measuring section 300. If centering is performed by the alignment unit corresponding to the notch 2a and the cutout formed in the frame 2, orientation of the transport carrier 10 loaded on the measuring stage 301 can always be the same.

Timing of centering is not specifically limited as long as it is before the position measuring process. For example, centering can be performed within the cassette section 100 before the transport carrier 10 is taken out, in the middle of the transport from the cassette section 100 to the position measuring section 300 or within the position measuring section 300 before the position measurement is performed.

(Transport Mechanism and Control Section)

For example, the transport mechanism 200 includes the transport fork 201 holding the transport carrier 10 and the transport arm 202 supporting the transport fork 201. As described above, dropping-in and the like for centering the transport carrier 10 may be provided in the transport fork 201.

The transport mechanism 200 transports the transport carrier 10 from the cassette section 100 to the position measuring section 300, from the position measuring section 300 to the plasma processing section 400, furthermore, and from the plasma processing section 400 to the cassette section 100 again (see M1 to M6 in FIG. 2). If a series of process is completed, the transport mechanism 200 enters the cassette section 100 again, another transport carrier 10 that is not plasma-processed is taken out from the cassette 101, and the series of transporting described above is newly started. An entering (holding) direction of the transport fork 201 with respect to the transport carrier 10 is always the same during a series transporting process.

The operation of the transport mechanism 200 is controlled by the control section 500. A feature of the embodiment is that the operation of the transport mechanism from the position measuring section 300 to the plasma processing section 400 is controlled by the control section 500 so that the transport carrier 10 is loaded on the plasma processing stage 411 to satisfy a predetermined positional relationship between the window section 424W and the substrate 1 based on position information of the substrate 1 with respect to the frame 2 measured by the position measuring section 300.

The transport mechanism 200 is controlled, as a basic operation, to transport the transport carrier 10 and to load the transport carrier 10 on the plasma processing stage 411 such that a point immediately above the rotation center C of the measuring stage 301 in the transport carrier 10 and the window section center Cc within the plasma processing section 400 match each other. If the frame center Cf and the substrate center Cw match by the control, the transport carrier 10 is loaded on the plasma processing stage 411 such that the substrate center Cw matches the window section center Cc. However, in practical, the frame center Cf and the substrate center Cw may not match due to lack of precision when the substrate 1 is pasted to the holding sheet 3.

In the embodiment, even if the frame center Cf and the substrate center Cw do not match, the deviation amount ΔR and the rotation angle θr are measured, position correction is performed when loading the transport carrier 10 on the plasma processing stage 411, and thereby the substrate center Cw and the window section center Cc directly match. In other words, positioning of the related art is performed when loading the transport carrier 10 on the plasma processing stage 411 based on the frame 2, but in the embodiment, positioning is performed based on the substrate 1. Thus, when holding the substrate 1 in the holding sheet 3, it is not necessary to match the substrate center Cw and the frame center Cf with high precision.

For example, in the embodiment, a specific control method and a method of matching the substrate center Cw and the window section center Cc are as follows. First, the control section 500 calculates the coordinates (Δx, Δy) of the substrate center Cw with respect to the frame center Cf (0, 0) in the coordinate system defined as described above from the deviation amount ΔR and the rotation angle θr measured by the position measuring section 300. Next, the control section 500 controls the transport mechanism 200 to lift the transport carrier 10 on the measuring stage 301 upward by the transport fork 201 and allows the transport carrier 10 to be separated from the measuring stage 301. Subsequently, the control section 500 controls the transport mechanism 200 to move the transport fork 201 in parallel to match the rotation center C of the measuring stage 301 and the substrate center Cw, and performs the position correction to move the entirety of the transport carrier 10 in the x axis direction by −Δx and in the y axis direction by −Δy. Thereafter, the control section 500 controls the transport mechanism 200 to load the transport carrier 10 held by the transport fork 201 on the measuring stage 301 again.

The transport mechanism 200 performs the position correction and thereby the substrate center Cw is positioned at the rotation center C of the measuring stage 301. Thus, after the transport mechanism 200 performs the position correction, if the transport carrier 10 is transported according to the basic operation described above, the transport carrier 10 is loaded on the plasma processing stage 411 to match the substrate center Cw and the window section center Cc. Moreover, in the embodiment, the control method is described in which after the position correction of the transport carrier 10 is performed within the position measuring section 300 based on the measurement result of the edge position, the transport carrier 10 is transported to the plasma processing stage 411 according to the basic operation. However, a specific control method is not limited to the embodiment. For example, after measuring the edge position, the position correction of the transport carrier 10 is not performed within the position measuring section 300, the transport carrier 10 is transported to the plasma processing section 400 as it is, and the position correction may be performed based on the measurement result of the edge position when loading the transport carrier 10 on the upper end surfaces of the lifting pins 419.

(Determination Section)

The plurality of lifting pins 419 are disposed in the plasma processing stage 411 (see FIG. 3). Two or more, preferably four or more lifting pins 419 are disposed such that the transport carrier 10 can be held horizontally during elevating and lowering. The transport fork 201 loads the transport carrier 10 on the upper end surface of the plurality of lifting pins 419 in a state where the lifting pins 419 are elevated. The lifting pins 419 receiving the transport carrier 10 are lowered to the same level as the plasma processing stage 411 and then the transport carrier 10 is loaded on the plasma processing stage 411.

If moving distances of the transport carrier 10 in an x axis direction and/or a y axis direction that is performed for the position correction are great, the transport carrier 10 cannot be loaded on the upper end surfaces of the lifting pins 419. Even if the transport carrier 10 can be loaded on the upper end surfaces of the lifting pins 419, the transport carrier 10 is not supported horizontally or a part of the transport carrier 10 may be out of an effective region of the plasma processing stage 411. Thus, it is preferable that a limit is provided in the movement by the position correction. For example, it is preferable that the plasma processing apparatus includes the determination section 600 that determines whether or not the position (specifically, the deviation amount ΔR of the substrate center Cw from the frame center Cf and the deviation direction R obtained from the rotation angle θr) of the substrate 1 obtained by the position measuring section 300 is within an allowable range P. Only if the determination is within the allowable range, the control section 500 controls the transport mechanism 200 to load the transport carrier 10 on the plasma processing stage 411. The transport carrier 10 out of the allowable range P is, for example, transported to the cassette section 100 again as a sticking precision defective product of the substrate 1.

As described above, the allowable range P can be determined from the viewpoint of whether or not the transport carrier 10 can be loaded on the upper end surfaces of the lifting pins 419, whether or not the transport carrier 10 is fitted to the effective region of the plasma processing stage 411, and the like. Here, the effective region of the plasma processing stage 411 indicates a region where the plasma processing can be performed with respect to the transport carrier 10 on the plasma processing stage 411. In the effective region, the transport carrier 10 is physically capable of being loaded. In addition, functions of electrostatic chucking, cooling, and the like included in the plasma processing stage 411 are normally operated with respect to the loaded transport carrier 10 in the effective region without physical interference between the loaded transport carrier 10 and peripheral members such as the cover 424. Hereinafter, an example of a case where the allowable range P is determined by the positional relationship between the lifting pins 419 and the transport carrier 10 is described.

Figure 6A:
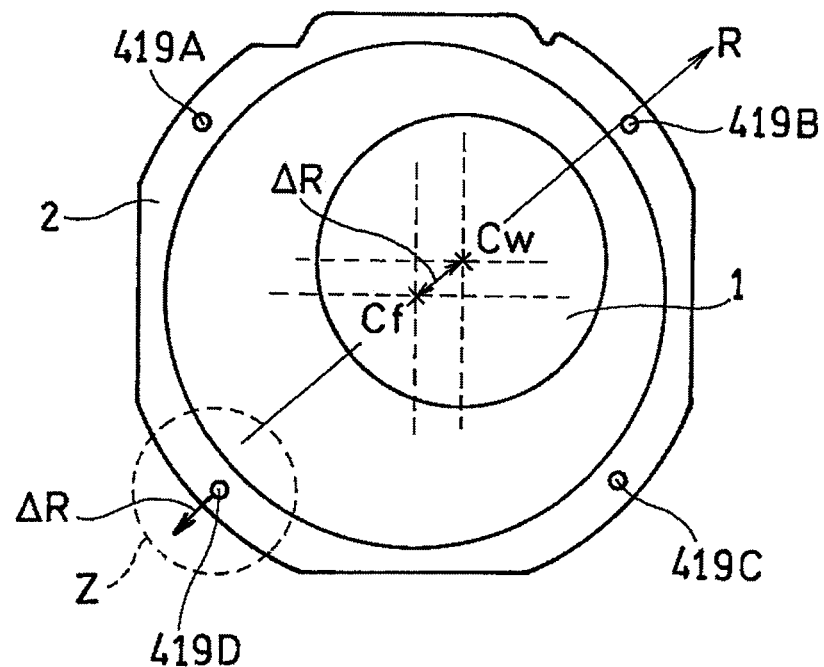
FIG. 6A is a top view illustrating the transport carrier holding the substrate loaded on a plasma processing stage according to the embodiment of the invention, in which the cover is omitted.
Figure 6B:
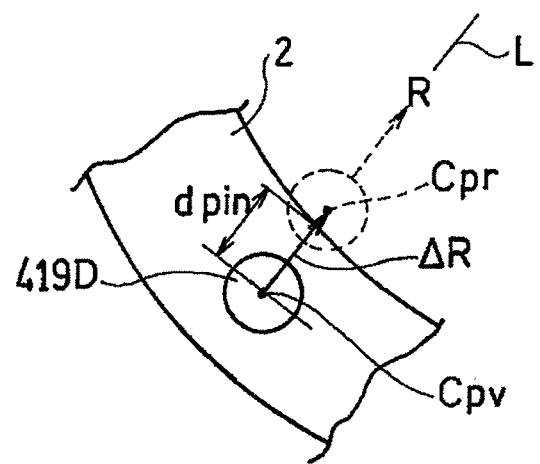
FIG. 6B is an enlarged view illustrating an enlarged portion Z in FIG. 6A.

FIG. 6A is a view of the transport carrier 10 that is loaded on the plasma processing stage 411 to match the frame center Cf and the window section center Cc, which is viewed from above. Moreover, for the sake of convenience, the cover 424 is omitted. Typically, the lifting pins 419A to 419D are disposed to hold a virtual frame at substantially equal intervals based on a position of the virtual frame if the virtual frame is loaded to match the frame center Cf and the window section center Cc. Further, the lifting pins 419A to 419D are respectively arranged at positions in which approximately the center point of the virtual frame in the width direction can be supported. In FIG. 6B, a support point of the frame 2 supported by the lifting pin 419D is a reference support point Cpv if the transport carrier 10 is loaded on the plasma processing stage 411 to match the frame center Cf and the window section center Cc (that is, the frame 2 matches the virtual frame).

Hereinafter, in a case where the deviation amount between the frame center Cf and the substrate center Cw is ΔR and the deviation direction is R, a specific determination method of the allowable range P is described with reference to FIG. 6B.

FIG. 6B is an enlarged view enlarging a part Z of FIG. 6A. In FIG. 6B, the window section center Cc and the substrate center Cw match by moving the transport carrier 10 in the opposite direction to the deviation direction R by ΔR. The lifting pin 419D is moved to the opening of the frame 2 and to the deviation direction R relatively by ΔR by the movement. The support point of the frame 2 is also moved from the reference support point Cpv to Cpr and to the deviation direction R by ΔR by the lifting pin 419D.

In the frame 2, a distance that is parallel to the deviation direction R and is from the reference support point Cpv to the end portion of the frame 2 in the detection direction R on a straight line L when drawing the straight line L passing through the reference support point Cpv is dpin. If the deviation amount ΔR is greater than the distance dpin, a support point Cpr of the frame 2 by the lifting pin 419D is out of the frame 2 and cannot appropriately support the frame 2. If the deviation amount ΔR is equal to or less than the distance dpin, a support point Cpr of the frame 2 by the lifting pin 419D is not out of the frame 2 and can support the frame 2. Thus, the allowable range P is a range satisfying ΔR≤dpin.

Also, regarding the lifting pins 419A to 419C disposed in other positions, the concept is the same. If a position adjustment of the transport carrier 10 is performed exceeding the allowable range P that is set to each of the lifting pins 419A to 419D, the transport carrier 10 is not supported horizontally. Thus, in all lifting pins 419 (419A to 419D), it is preferable that each distance dpin from the reference support point Cpv to the end portion of the frame 2 in the deviation direction R is ΔR≤dpin. If a relationship of ΔR≤dpin is satisfied, the determination section 600 determines it is within the allowable range P and transmits a determination result to the control section 500.

A size of the distance dpin is determined by a width of the frame 2 and the deviation direction R. A shape and size of the frame 2 that is subjected to one plasma processing apparatus 20 are determined in advance and shapes and positions of the lifting pins 419 are also constant. Thus, information of the distance dpin in each deviation direction R can be obtained in advance based on the shape of the frame 2, disposition of the lifting pins 419, and the like. Thus, for example, a procedure of determination by the determination section 600 can be performed as follows.

Information of the deviation amount ΔR and the deviation direction R measured and derived by the position measuring section 300 is transmitted to the determination section 600. In the determination section 600, the distance dpin from the end portion of the frame 2 to the reference support point Cpv in the same direction as the deviation direction R is obtained. It is determined whether or not ΔR≤dpin by comparing the distance dpin with the deviation amount ΔR.

The determination result is transmitted to the control section 500. If the determination result is ΔR≤dpin, the control section 500 controls the transport mechanism 200 to allow the transport carrier 10 to enter the plasma processing section 400, and if ΔR>dpin, the control section 500 controls the transport mechanism 200 to allow the transport carrier 10 to enter the cassette section 100 again. In the embodiment, a case where the allowable range P is determined by the positional relationship between the lifting pins 419 and the transport carrier 10 is described, but as described above, the allowable range P is determined based on whether or not the transport carrier 10 is fitted to the effective region of the plasma processing stage 411 and determination may be performed whether the transport carrier 10 is to be loaded on the plasma processing stage 411.

Figure 7:
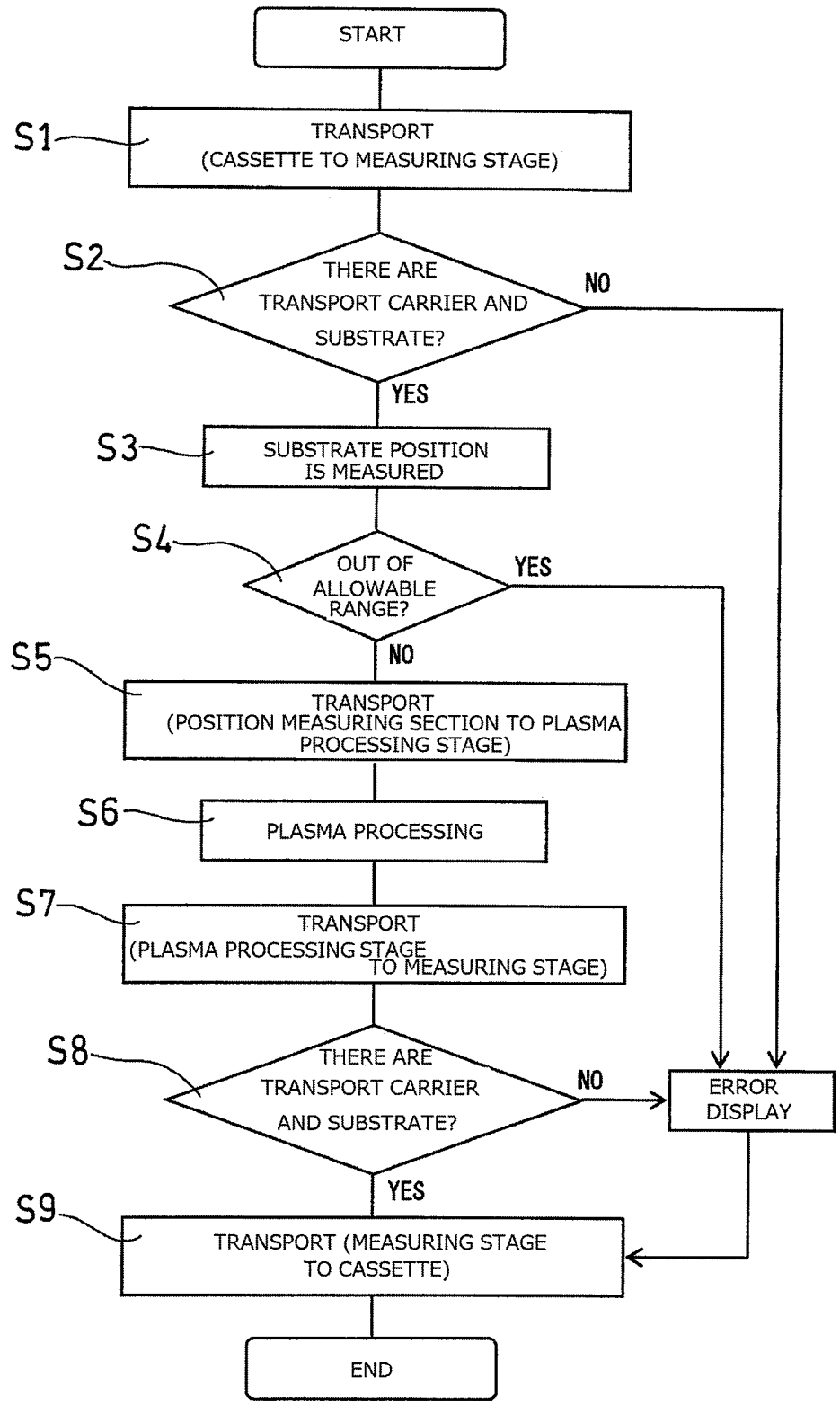
FIG. 7 is a flowchart illustrating a plasma processing method according to the embodiment of the invention.

A specific process executed by the plasma processing apparatus according to the embodiment is illustrated by a flowchart of FIG. 7. Prior to start of a process 1 (S1), the plurality of transport carriers 10 are accommodated in the cassette 101.

In the process 1 (S1), the transport mechanism 200 is operated and the transport fork 201 enters the inside of the cassette section 100 (M6). The entered transport fork 201 holds one of the plurality of transport carriers 10 accommodated in the cassette 101.

Next, the transport fork 201 is exited from the cassette section 100 while holding the transport carrier 10, rotates, and moves to the inside of the position measuring section 300 together with the transport carrier 10 (M1 and M2). Subsequently, the transport arm 202 is lowered above the measuring stage 301 and loads the transport carrier 10 held by the transport fork 201 on the measuring stage 301. Thereafter, the transport arm 202 and the transport fork 201 are exited from the position measuring section 300 (M3).

If the transport carrier 10 is loaded on the measuring stage 301, presence or absence of the substrate 1, the frame 2, and the holding sheet 3 is determined (process 2: S2). A method of determining presence or absence of the substrate 1 and the like is not specifically limited and a transmission sensor may be used or visual check may be performed by a camera and the like. If it is determined that any one of the substrate 1, the frame 2, and the holding sheet 3 is absent, the transport fork 201 enters the position measuring section 300 again, receives the transport carrier 10 loaded on the measuring stage 301, and is exited from the position measuring section 300 (M2 and M3). For example, the transport carrier 10 that is taken out from the position measuring section 300 is transported to the cassette section 100 again (M3 and M6) and is returned to the cassette 101. Here, if a display section such as a display device is provided in the plasma processing apparatus and it is determined that any one of the substrate 1, the frame 2, and the holding sheet 3 is absent, an error message may be displayed. The error message may be a voice such as a warning sound.

The determination of presence or absence of the substrate 1 and the like is not necessary to be performed in the position measuring section 300 and may be performed in the middle of the transport path from the cassette section 100 to the position measuring section 300. For example, the transport fork 201 holds the transport carrier 10 and the determination may be performed at timing immediately after the transport fork 201 is exited from the cassette section 100. In this case, if it is determined that any one of the substrate 1, the frame 2, and the holding sheet 3 is absent, the transport mechanism 200 allows the transport carrier 10 to enter the cassette section 100 again without entering the position measuring section 300 and is returned to the cassette 101. Thereafter, the transport fork 201 is exited from the cassette section 100 once (M1) and enters the cassette 101 again (M6). Then, the transport fork 201 holds another transport carrier 10 and a new process 1 is started.

For the transport carrier 10 in which it is determined that all the substrate 1, the frame 2, and the holding sheet 3 are present, the position of the substrate 1 with respect to the frame 2 is measured by the position measuring section 300 (process 3: S3). The method of measuring the position, in which the measuring stage 301 is disposed in the position measuring section 300 and the deviation amount ΔR between the frame center Cf and the substrate center Cw and the rotation angle θr are measured while rotating the transport carrier 10 loaded on the measuring stage 301, is preferable because it is simple. A specific measuring method is as described above.

Position information of the substrate 1 measured by the position measuring section 300 is transmitted to the determination section 600. As described above, for example, the determination section 600 determines whether or not the deviation amount ΔR between the frame center Cf and the substrate center Cw satisfies ΔR≤dpin (process 4: S4). If the relationship of ΔR≤dpin is satisfied, the determination section 600 determines it is within the allowable range P and transmits the determination result to the control section 500. The control section 500 controls the transport mechanism 200 to allow the transport carrier 10 to enter the plasma processing section 400 based on the determination. That is, the transport fork 201 enters the position measuring section 300 again (M2), receives the transport carrier 10 loaded on the measuring stage 301 and is exited (M3).

On the other hand, if the determination result is ΔR>dpin, the control section 500 controls the transport mechanism 200 to allow the transport carrier 10 to enter the cassette section 100 again. Also, in this case, the error may be transmitted by displaying the error massage or by the voice such as the warning sound. That is, the transport mechanism 200 transports the transport carrier 10 to the cassette section 100 again (M6) and returns to the cassette 101. Thereafter, the transport fork 201 is exited from the cassette section 100 once (M1) and enters the cassette section 100 again (M6). Next, the transport fork 201 holds another transport carrier 10 and a new process 1 is started.

If the determination section 600 determines that ΔR≤dpin, the process precedes to a process 5 (S5) and the transport mechanism 200 transports the transport carrier 10 to the plasma processing section 400 as it is (M4). In the embodiment, the transport mechanism 200 that is controlled by the control section 500 moves the transport fork 201 in parallel by the deviation amount ΔR in the opposite direction to the deviation direction R and performs the position correction to match the substrate center Cw on the measuring stage 301 and the rotation center C of the measuring stage 301. Next, the transport mechanism 200 transports the transport carrier 10 on the inside of the plasma processing section 400 to match the rotation center C of the measuring stage 301 and the window section center Cc according to the basic operation. That is, the transport carrier 10 is loaded on the plasma processing stage 411 by the control to match the substrate center Cw and the window section center Cc.

The plurality of lifting pins 419 are in stand-by in a state of being elevated to support the transport carrier 10 within the plasma processing section 400. The cover 424 is also in stand-by at an elevated position. The transport fork 201 that enters the inside of the plasma processing section 400 (M4) loads the transport carrier 10 which is position-corrected on the upper end surfaces of the plurality of lifting pins 419 and is exited (M5). If it is confirmed that the transport fork 201 is exited, a gate valve (not illustrated) separating the plasma processing section 400 and the transport mechanism 200 side is closed and the plasma processing section 400 is in a state of being closed. Subsequently, the plasma processing is executed with respect to the substrate 1 (process 6: S6).

The plasma processing is performed by the following detailed description.

First, the lifting pins 419 are lowered and the transport carrier 10 is loaded on the plasma processing stage 411. Subsequently, the lifting rod 426 is driven by the driving mechanism 427 and the cover 424 is lowered to a predetermined position. If the cover 424 is disposed at a predetermined lowered position, the frame 2 and a portion of the holding sheet 3 which does not hold the substrate 1 are covered by the cover 424 without coming into contact with the cover 424, and the substrate 1 is exposed from the window section 424W of the cover 424.

Next, a DC voltage is applied from the DC power supply 423 to the electrostatic chucking electrodes 422a and the substrate 1 is held on the plasma processing stage 411 by the electrostatic chucking.

Process gas is introduced from the process gas source 412 into the inside of the vacuum chamber 403 via the gas introduction port 403a, gas is exhausted from the exhaust port 403b by the decompressing mechanism 414, and a predetermined pressure is maintained within the vacuum chamber. Thereafter, high-frequency power is supplied from the first high-frequency power supply 410A to the antenna 409 and the plasma P is generated within the vacuum chamber 403. The generated plasma P is configured of ions, electrons, radicals, and the like. Incident energy of ions into the substrate 1 can be controlled by a bias voltage applied from the second high-frequency power supply 410B to a high-frequency electrode 442b. A portion which is exposed from the resist mask formed on the substrate 1 is removed by a physical-chemical reaction with the generated plasma P from a front surface to a back surface thereof, and the substrate 1 is diced.

The cover 424 is in the lowered position during the plasma processing. The frame 2 and a portion of the holding sheet 3 which does not hold the substrate 1, covered by the cover 424, are protected from the plasma irradiation. Thus, it is possible to suppress deformation and deterioration due to heat.

After dicing, ashing is performed. Gas is exhausted by the decompressing mechanism 414 and the inside of the vacuum chamber 403 is maintained at a predetermined pressure while introducing process gas (for example, oxygen gas) for ashing into the vacuum chamber 403 from the ashing gas source 413. Thereafter, high-frequency power is supplied from the first high-frequency power supply 410A to the antenna 409, oxygen plasma is generated within the vacuum chamber 403, and the resist mask of the surface of the substrate 1 (chip) exposed from the window section 424W of the cover 424 is completely removed.

If all the processes in the plasma processing section 400 are completed, the lifting pins 419 are elevated and the gate valve is opened. Next, the transport fork 201 enters the inside of the vacuum chamber 403 (M4) and the transport carrier 10 is received from the lifting pins 419 (process 7: S7). The transport fork 201 holds the transport carrier 10, is exited from the plasma processing section 400 (M5), is rotated, and is moved to the inside of the position measuring section 300 again together with the transport carrier 10 (M2).

Presence or absence of the substrate 1 and the like is determined again within the position measuring section 300 (process 8: S8). If it is determined that any one of the substrate 1, the frame 2, and the holding sheet 3 is absent, the error is displayed or the warning sound is issued, and the transport mechanism 200 allows the transport carrier 10 to enter the cassette section 100 and returns to the cassette 101. If it is determined that all the substrate 1, the frame 2, and the holding sheet 3 are present, the transport carrier 10 enters the cassette section 100 and is accommodated in the cassette 101 (process 9: S9). The transport carrier 10 in error and the transport carrier 10 in normal may be accommodated in the same cassette 101 or may be accommodated in separated cassettes. If the both transport carriers are accommodated in the same cassette, an accommodation position of the transport carrier 10 in error may be displayed on a screen.

As described above, the determination of presence or absence of the substrate 1 and the like is not necessary to be performed within the position measuring section 300 and may be performed in the middle of the transport path from the plasma processing section 400 to the cassette section 100. In this case, following the process 7, the transport carrier 10 is not necessary to enter the inside of the position measuring section 300 and the transport carrier 10 may enter the cassette section 100. Thus, a series of the plasma processing is completed.

The invention is not limited to the embodiments and various changes can be performed.

The plasma processing apparatus of the embodiments of the invention is useful as an apparatus in which the substrate held on the transport carrier is plasma-processed.

What is claimed is:

1. A plasma processing method for performing plasma processing to a substrate held on a transport carrier, the transport carrier including a frame and a holding sheet that covers an opening of the frame, the substrate being held on the holding sheet, the plasma processing method comprising:
- measuring a position of the substrate with respect to the frame and digitizing the position of the substrate with respect to the frame by a position measuring section; and
- performing plasma processing by loading the transport carrier holding the substrate on a plasma processing stage included in a plasma processing section, covering the frame and at least a part of the holding sheet by a cover, and exposing at least a part of the substrate from a window section provided in the cover, wherein
- the transport carrier holding the substrate is loaded on the plasma processing stage to satisfy a predetermined positional relationship between the window section and the substrate based on information of the position of the substrate with respect to the frame which is measured by the position measuring section, and wherein
- the predetermined positional relationship is satisfied when a center of the substrate is aligned with a center of the window section.

2. The plasma processing method according to claim 1, further comprising:
- determining whether or not the position of the substrate measured by the position measuring section is within an allowable range after the measuring of the position, wherein
- the transport carrier holding the substrate is loaded on the plasma processing stage only if the position of the substrate is determined to be within the allowable range.

3. The plasma processing method according to claim 1, wherein
- in the measuring of the position, the transport carrier holding the substrate is loaded on a measuring stage, and a deviation amount between the center of an opening of the frame and a center of the substrate is measured while rotating the transport carrier that holds the substrate loaded on the measuring stage.

4. The plasma processing method according to claim 1, wherein
- in the measuring of the position, the position measuring section measures a deviation amount between a center of an opening of the frame and the center of the substrate, and a direction of the deviation.

5. The plasma processing method according to claim 4, wherein
- in the measuring of the position, the transport carrier holding the substrate is loaded on a measuring stage which is rotatable around a rotation center of the measuring stage, such that the center of the opening of the frame and the rotation center match, and the deviation amount and the direction of the deviation are measured while rotating the transport carrier on the measuring stage.

6. The plasma processing method according to claim 5, wherein
- the loading of the transport carrier holding the substrate on the plasma processing stage to satisfy the predetermined positional relationship is performed by a transport mechanism after transporting the transport carrier from the measuring stage to the plasma processing section, based on information of the position of the substrate with respect to the frame which is measured by the position measuring section.

7. A plasma processing method for performing plasma processing to a substrate held on a transport carrier, the transport carrier including a frame and a holding sheet that covers an opening of the frame, the substrate being held on the holding sheet, the plasma processing method comprising:
- loading the transport carrier holding the substrate on a measuring stage of a position measuring section;
- measuring a position of the substrate with respect to the frame and digitizing the position of the substrate with respect to the frame by the position measuring section; and
- performing plasma processing by loading the transport carrier holding the substrate on a plasma processing stage included in a plasma processing section, covering the frame and at least a part of the holding sheet by a cover, and exposing at least a part of the substrate from a window section provided in the cover, wherein
- the transport carrier holding the substrate is loaded on the plasma processing stage to satisfy a predetermined positional relationship between the window section and the substrate based on information of the position of the substrate with respect to the frame which is measured by the position measuring section, and wherein
- the loading of the transport carrier holding the substrate on the plasma processing stage to satisfy a predetermined positional relationship is performed by a transport mechanism after transporting the transport carrier from the measuring stage to the plasma processing section, based on information of the position of the substrate with respect to the frame which is measured by the position measuring section.

8. The plasma processing method according to claim 7, wherein the predetermined positional relationship is satisfied when the center of the substrate is aligned with the center of the window section.

9. The plasma processing method according to claim 7, further comprising:
- determining whether or not the position of the substrate measured by the position measuring section is within an allowable range after the measuring of the position, wherein
- the transport carrier holding the substrate is loaded on the plasma processing stage only if the position of the substrate is determined to be within the allowable range.

10. The plasma processing method according to claim 7, wherein in the measuring of the position, a deviation amount between a center of an opening of the frame and the center of the substrate is measured while rotating the transport carrier that holds the substrate loaded on the measuring stage.

11. The plasma processing method according to claim 7, wherein in the measuring of the position, the position measuring section measures a deviation amount between a center of an opening of the frame and the center of the substrate, and a direction of the deviation.

12. The plasma processing method according to claim 11, wherein in the measuring of the position, the measuring stage is rotatable around a rotation center of the measuring stage, such that the center of the opening of the frame and the rotation center match, and the deviation amount and the direction of the deviation are measured while rotating the transport carrier on the measuring stage.

* * * * *